United States Patent [19]

Pressley

[11] 4,415,373

[45] Nov. 15, 1983

[54] LASER PROCESS FOR GETTERING DEFECTS IN SEMICONDUCTOR DEVICES

[75] Inventor: Robert J. Pressley, Cupertino, Calif.

[73] Assignee: Allied Corporation, Morris Township, Morris County, N.J.

[21] Appl. No.: 322,123

[22] Filed: Nov. 17, 1981

[51] Int. Cl.³ .................... H01L 21/265; B23K 27/00
[52] U.S. Cl. .................................. 148/1.5; 29/576 B; 148/187; 357/91; 427/53.1
[58] Field of Search ............... 148/1.5, 187; 29/576 B; 427/53.1; 357/91

[56] References Cited

U.S. PATENT DOCUMENTS

| | | | |
|---|---|---|---|
| 3,874,936 | 4/1975 | D'Hervilly et al. | 148/1.5 |
| 3,929,512 | 12/1975 | Nicholas et al. | 148/1.5 |
| 3,940,289 | 2/1976 | Marquardt et al. | 148/1.5 |
| 3,997,368 | 12/1976 | Petroff et al. | 148/1.5 |
| 4,131,487 | 12/1978 | Pearce et al. | 148/1.5 |
| 4,181,538 | 1/1980 | Narayan et al. | 148/1.5 |
| 4,249,962 | 2/1981 | Celler | 148/1.5 |
| 4,257,827 | 3/1981 | Schwuttke et al. | 148/1.5 |
| 4,319,119 | 3/1982 | Runge | 148/1.5 |
| 4,332,627 | 6/1982 | Schmitt et al. | 148/1.5 |
| 4,359,486 | 11/1982 | Patalong et al. | 357/1.5 |

OTHER PUBLICATIONS

Burggraaf Semiconductor Int., Sep. 1980, p. 43–60.
Chu et al. IBM-TDB, 22 (1980) p. 5335.
Leighton et al. IBM-TDB, 22 (1980) 3192–3193.
White et al. J. Appl. Phys. 50 (1979) 326.
Joshi et al. IBM-TDB, 11 (1968) 104.

Primary Examiner—Upendra Roy
Attorney, Agent, or Firm—James Risenfeld; Gerhard H. Fuchs

[57] ABSTRACT

A process for gettering defects in a semiconductor is provided. The process comprises using a laser beam to drive a dopant material into a melted non-active surface of a semiconductor device, followed by heating the semiconductor to drive defects to traps formed by the dopant. The process creates in the bulk of the semiconductor strain fields that not only trap defects, which would otherwise degrade device performance, but also hold the defects during subsequent processing steps.

10 Claims, 7 Drawing Figures

LASER PROCESS FOR GETTERING DEFECTS IN SEMICONDUCTOR DEVICES

BACKGROUND OF THE INVENTION

1. Field of the Invention

This invention relates to a process for gettering defects in semiconductor devices. The process accomplishes gettering by first scanning a surface of the semiconductor with a laser beam to drive in a dopant and then heating the semiconductor.

2. Description of the Prior Art

During the fabrication of a semiconductor device, such as an integrated circuit, unwanted defects are generated in the bulk of the semiconductor near the active surface region. These defects degrade device performance and reduce yield of acceptable devices. At elevated temperatures defects become more mobile and can travel to regions of high strain field. If a strain field is deliberately created away from the active surface of a device, then, during a high temperature cycle, defects can be trapped there and prevented from interfering with device performance. Among the techniques that have been used to form the requisite strain field has been scanning a laser beam over the back surface (or other "distant" area) to induce lattice damage and strain. That technique has beeen disclosed in U.S. Pat. No. 4,131,487, issued Dec. 26, 1978, to Pearce et al.; U.S. Pat. No. 4,257,827, issued Mar. 24, 1981, to Schwuttke et al.; and Burggraaf, *Semiconductor International*, Sept., 1980, page 52.

An alternative gettering technique that has been disclosed involves thermal diffusion of dopants into the semiconductor bulk from the back surface, thereby creating lattice distortion. For example, Petroff et al., U.S. Pat. No. 3,997,368, issued Dec. 14, 1976, discloses a process for gettering stacking faults by forming a stressed layer on the back surface of a wafer, preferably preceded by thermally diffusing phosphorus into the back surface.

Although the gettering processes of the prior art are effective to a limited degree, their effectiveness can be impaired by subsequent treatment of the semiconductor device and/or by generation of a concentration of defects greater than that which can effectively be eliminated by their gettering action.

Another process that has been accomplished with lasers is dopant diffusion. In preparing n-type and p-type junctions, dopants that had been deposited or spun on semiconductor wafer surfaces were diffused into the bulk by exposing the wafers to suitable laser beams. This technique has been disclosed by Burggraaf, op. cit., p. 54.

SUMMARY OF THE INVENTION

In accordance with the present invention, a process for gettering defects in a semiconductor is provided. The process comprises the steps of providing a dopant material at a surface of the semiconductor; generating a laser beam at a wavelength that is absorbed by the surface; directing the beam onto the surface to melt the area of incidence on the surface and to diffuse the dopant into the semiconductor; and heating the semiconductor at a temperature and for a time sufficient to drive defects to traps formed by the dopant in the semiconductor.

The invention provides a gettering process that not only can trap a large number of defects produced during the various steps of semiconductor device manufacture but also can bind the defects throughout those steps. For convenience, the surface near which defects are trapped is referred to as the non-active surface (NAS) in the following specification. As discussed above, the NAS is typically the back surface but may also be a non-active section of another surface.

DETAILED DESCRIPTION OF THE INVENTION

Figure 1A:
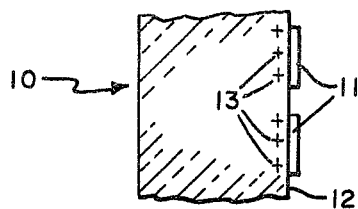
FIG. 1A depicts a schematic cross section of a wafer before gettering.
Figure 1B:
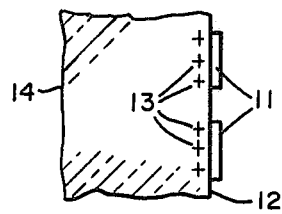
FIGS. 1B, 1C, and 1D depict sequentially a gettering process of the prior art.

The present invention provides an improved gettering process for use in semiconductor manufacturing. The process involves diffusing dopant atoms (or ions) into a non-active surface (NAS) of a semiconductor by irradiating the surface with a laser beam.

Semiconductors suitable for the process of the present invention include silicon and GaAs, both of which strongly absorb the deep red radiation emitted by an alexandrite laser, which is the preferred laser source. In what follows, the semiconductor is chosen to be silicon; however, the process would be similar for other semiconductors.

In a typical embodiment of the present process a device is fabricated on the front surface of a single crystal silicon wafer. During fabrication, defects are unintentionally created in the bulk of the silicon near the active electrical regions. The defects can degrade device performance if they remain near the active regions. To move these defects to trap sites outside the active region, a strain field and associated traps are first created by driving in a dopant near an NAS; for example, the back surface of the wafer. Mobile defects are then driven to these traps by heating the semiconductor.

The dopant atom is selected primarily on the basis of two criteria. First, the dopant should cause maximum lattice strain in order to act as an effective trap for defects. The strain induced by a dopant atom depends on its size and on whether it is present substitutionally or interstitially. A large interstitial dopant atom causes the greatest lattice strain and is therefore preferred. Secondly, the dopant atom should have minimum diffusivity, so that it remains substantially immobile during subsequent processing steps. Specifically, if the dopant atom diffuses to a surface, its trapping efficiency is reduced or eliminated. Alternatively, if it diffuses into the active region, it can degrade device performance.

To some extent the criteria of high strain and low diffusivity are inconsistent, since interstitial impurities generally show high diffusivity compared with substitutional impurities. Much information to guide selection of suitable dopants has been published. Exemplary are: A.S. Grove, *Physics and Technology of Semiconductor Devices*, Chap. 3, and the references cited therein. Beyond reference to published data, routine experimentation yields the dopant which is optimum for a particular situation. Arsenic, boron, tin, tungsten, and molybdenum are typical of dopants that are suitable for use with silicon. These atoms can be readily incorporated into silicon that is locally melted by the laser beam, but they do not readily diffuse out of the solidified material during subsequent processing of the device.

Contact between the dopant and semiconductor NAS may be accomplished by applying to the NAS a liquid that incorporates the dopant, such as the well-known spin-on technique; by vapor deposition or sputtering of the dopant onto the NAS; or by applying the dopant by ion implantation. After contact is made between dopant and NAS, the laser beam is scanned across the NAS, thereby causing local surface melting and causing the dopant to diffuse into the bulk of the wafer.

The final step, heating the semiconductor, may be performed simply in order to move mobile defects to traps associated with the lattice strain field. Alternatively, the heating step may be a later processing step of the type that is routinely performed in semiconductor device fabrication. Temperatures in the range from about 700° C. to about 1000° C. or higher and times of the order of 30 minutes are suitable.

A preferred apparatus for carrying out the process of the present invention is disclosed in copending application of R. J. Pressley, Optical Beam Homogenizer, Ser. No. 322,124, and the disclosure of that application is incorporated herein by reference. The apparatus is adapted for exposing material to a laser beam having a substantially uniform power density over a predetermined area. It comprises, in combination, a laser whose output beam is directed to a beam homogenizer, which divides and redirects the laser beam, and means for supporting the material. An alexandrite laser is a preferred source. An alexandrite laser beam has a wavelength that can be selected anywhere in the range from about 700-815 nm by suitable adjustments of a tuning element.

The beam homogenizer may consist of two segmented cylindrical optical elements having their axes at right angles to each other to provide a beam of uniform intensity over a square area, typically about 3 mm on a side, on a semiconductor surface.

More preferably, an apparatus includes, instead of the homogenizer, a "concentrator" of the type disclosed in copending application of R. J. Pressley, Optical Beam Concentrator Ser. No. 322,125, incorporated herein by reference. The beam concentrator comprises a segmented cylindrical optical element in combination with a conventional (not segmented) cylindrical optical element, the two cylindrical elements having their axes at right angles to each other to provide on the semiconductor surface a narrow rectangular area of uniform power density along its length. The rectangular area is typically about 3 mm×0.1 mm.

A pattern of regions of driven-in dopant can be formed by using a pulsed laser and moving the semiconductor relative to the laser beam. The movement can be the same size as the beam width (or slightly larger to provide some overlap) to provide uniform exposure over a surface large compared with the beam area. Alternatively, the movements can be chosen to provide gaps between adjoining exposed areas. The latter is preferred, because it causes greater lattice distortion.

The gettering process may be done at any time before, during, or after the device fabrication. Thereafter the wafer may be processed and annealed many times without impairing the strain field that accomplishes the defect trapping.

Figure 1E:
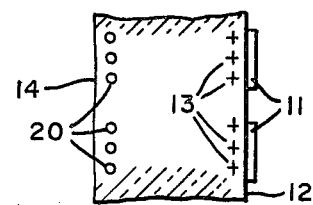
FIGS. 1E, 1F, and 1G depict the gettering process of the present invention.
Figure 1C:
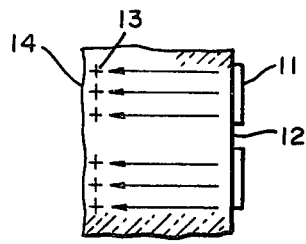

FIGS. 1A-1G illustrate the present process and that of the prior art. FIG. 1A depicts a cross section of a wafer 10 at a point in device fabrication where pattern elements 11 have been formed on front surface 12, and defects 13 have been created as a result. Gettering is directed at eliminating these defects lest they degrade device performance. In a typical prior art gettering method, the wafer's back surface 14 is damaged (FIG. 1B) to create a strain field. When the wafer is heated, e.g. in a subsequent fabricaion step, defects 13 are attracted to and trapped at back surface 14 (FIG. 1C). However, if the wafer is again heated, lattice strain may be annealed out and the defects may be released from back surface 14 to redistribute themselves in the bulk of the wafer (FIG. 1D) and degrade device performance.

Figure 1F:
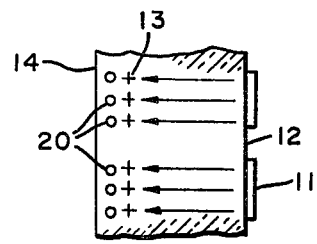
Figure 1D:
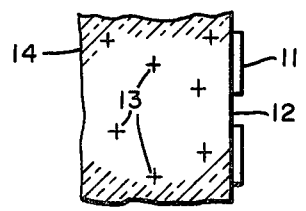
Figure 1G:
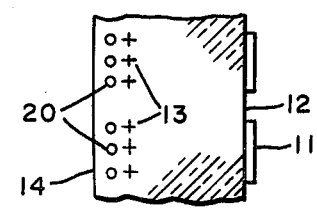

In the present process, exposure to a laser beam locally melts back surface 14 and thereby drives dopant atoms 20 into the bulk of the wafer (FIG. 1E). On subsequent heating of the wafer, dopant atoms 20 attract and trap defects 13 (FIG. 1F). In contrast with the prior art situation, these trapped defects are *not* released during subsequent processing steps (FIG. 1G).

The following examples are presented in order to provide a more complete understanding of the invention The specific techniques, conditions, materials, and reported data set forth to illustrate the principles and practice of the invention are exemplary and should not be construed as limiting the scope of the invention.

EXAMPLE 1

A 100 nm layer of tungsten is sputtered onto the back surface of a silicon wafer. The tungsten is driven into the silicon by successive exposures with a pulsed alexandrite laser. The incident laser beam has dimensions 3 mm×0.1 mm, with uniform intensity of 4 J/cm$^2$ over the length of the beam. Pulse duration is 100 ns. Between pulses, the surface is moved 1 mm in a direction normal to the 3 mm dimension of the beam, thus forming an array of parallel "lines". Succesive arrays of parallel lines are spaced 1 mm apart in the direction parallel to the 3 mm dimension of the beam. A device prepared on the front surface of the wafer operates with greatly reduced interference from defects generated during the preparation.

EXAMPLE 2

The process of Example 1 is repeated, except the material sputtered onto the back surface of the wafer is molybdenum. Thickness of the molybdenum layer is 100 nm.

I claim:

1. A process for gettering defects in a semiconductor wafer comprising the steps of:
    (a) providing a dopant material at a major surface of the wafer, that surface being opposite to a second surface of the wafer in which a semiconductor device is formed;
    (b) generating a laser beam at a wavelength that is absorbed by the major surface;
    (c) directing the beam onto the major surface to melt the area of incidence and to diffuse the dopant into the wafer; and
    (d) heating the wafer at a temperature and for a time sufficient to drive defects to traps formed by the dopant in the wafer.
2. The process of claim 1 wherein the dopant material is provided to the surface by applying to the surface a liquid that incorporates the dopant and then spinning the surface.
3. The process of claim 1 wherein the dopant material is provided to the surface by vapor deposition.

4. The process of claim 1 wherein the dopant material comprises an element selected from the group consisting of boron, arsenic, tin, tungsten, and molybdenum.

5. The process of claim 1 wherein the semiconductor comprises silicon.

6. The process of claim 1 wherein the laser beam is provided by an alexandrite laser.

7. The process of claim 1 comprising the further step of homogenizing the laser beam prior to step (c) so that the beam incident on the surface has substantially uniform power density.

8. The process of claim 1 comprising the further step of concentrating the laser beam prior to step (c) so that the beam incident on the surface is a narrow rectangular area of uniform power density along its length.

9. The process of claim 1 wherein the laser beam comprises a series of pulses and the surface is moved relative to the beam to provide a plurality of sequential exposures of the surface.

10. The process of claim 4 wherein the dopant comprises tungsten or molybdenum.

* * * * *